US006040745A

United States Patent [19]

Tanaka et al.

[11] Patent Number: 6,040,745

[45] Date of Patent: Mar. 21, 2000

[54] UNBALANCED-TO-BALANCED CONVERTER

[75] Inventors: Hiroaki Tanaka, Mishima-gun; Yutaka Sasaki, Nagaokakyo; Takuya Hashimoto, Kyoto, all of Japan

[73] Assignee: Murata Manufacturing Co., Ltd., Japan

[21] Appl. No.: 08/978,402

[22] Filed: Nov. 25, 1997

[30] Foreign Application Priority Data

Nov. 26, 1996 [JP] Japan .................................... 8-315215

[51] Int. Cl.[7] ........................................................ H03H 7/42

[52] U.S. Cl. ................................................ 333/26; 333/25

[58] Field of Search .......................................... 333/25, 26

[56] References Cited

U.S. PATENT DOCUMENTS 3,114,120 12/1963 Heck ..................................... 333/25 X
3,217,274 11/1965 Alford ................................... 333/26 X
4,739,289 4/1988 Cripps ....................................... 333/26

OTHER PUBLICATIONS

N. Nagai et al.: "Application of Distributed–Constant Network Theory to Balun Transformers" Electronics and Communications in Japan, vol. 50, No. 5, May 1967, New York, U.S., pp. 114–121, XP002056295.

Patent Abstracts of Japan, vol. 14, No. 457 (E–986) Oct. 2, 1990 & JP 02 184104 A (NEC Corp.) Jul. 18, 1990.

European Search Report dated Mar. 4, 1998.

*Primary Examiner*—Robert Pascal
*Assistant Examiner*—Justin P. Bettendorf
*Attorney, Agent, or Firm*—Ostrolenk, Faber, Gerb & Soffen, LLP

[57] ABSTRACT

An unbalanced-to-balanced converter (balun) comprising three distributed-constant lines. In one distributed-constant line, a standing wave is generated. Disposed adjacent thereto is another distributed-constant line to which the power of the standing wave is transferred. A signal input to the unbalanced-to-balanced converter is divided into two signals having phases 180 degrees apart and the same level.

6 Claims, 1 Drawing Sheet

UNBALANCED-TO-BALANCED CONVERTER

BACKGROUND OF THE INVENTION

1. Field of the Invention

The present invention relates to unbalanced-to-balanced converters (baluns), and more particularly, to an unbalanced-to-balanced converter used which is usable as a 180-degree phase shifter which divides one signal into two signals having phases 180 degrees apart and having the same level.

2. Description of the Related Art

FIG. 2 is a conventional unbalanced-to-balanced converter. In FIG. 2, an unbalanced-to-balanced converter 20 includes three microstriplines 21, 22, and 23 serving as first, second, and third distributed-constant lines disposed sufficiently close to each other that they are coupled with each other, a signal input terminal 24, and signal output terminals 25 and 26.

In FIG. 2, the signal input terminal 24 is connected to the left-hand end of the second microstripline serving as a signal input end, a signal output terminal 25 is connected to the right-hand end of the second microstripline serving as a first signal output end, and a signal output terminal 26 is connected to the right-hand end of the third microstripline serving as a second signal output end. The right-hand ends of the first and second microstriplines are connected to each other, and the left-hand ends of the first and the third microstriplines are grounded.

The microstriplines 21, 22, and 23 are designed such that their length equals one fourth the wavelength of a signal to be used.

In the unbalanced-to-balanced converter 20 configured as described above, when a signal is input to the signal input terminal 24, a part of the signal passes through the microstripline 22 and is output from the signal output terminal 25, and another part of the signal resonates in the microstripline 21 and generates a standing wave. The power of the standing wave generated in the microstripline 21 is transferred to the microstripline 23 and output from the signal output terminal 26. The microstriplines 21, 22, and 23 are disposed with intervals among them such that a signal output from the signal output terminal 25 has the same level as that output from the signal output terminal 26. The signals output from the signal output terminals 25 and 26 have phases 180 degrees apart. In this way, one signal is divided into two signals having phases 180 degrees apart and the same level.

In the above unbalanced-to-balanced converter 20, however, the distributed-constant line 21 in which the standing wave is generated is disposed away from the distributed-constant line 23 to which the power of the standing wave is transferred, with the distributed-constant line 22 being sandwiched therebetween. Therefore, the power is transferred to the distributed-constant line 23 with low efficiency. To transfer half of the power of an input signal, it is necessary to set the intervals among the distributed-constant lines very small. In this situation, advanced manufacturing technology is required, and the cost of manufacturing and of manufacturing equipment becomes high.

SUMMARY OF THE INVENTION

The present invention, however, is able to provide an unbalanced-to-balanced converter which requires neither small intervals between distributed-constant lines nor advanced manufacturing technology.

This feature of the present invention may be achieved through the provision of an unbalanced-to-balanced converter including first, second, and third distributed-constant lines disposed in this order in the horizontal direction in parallel to couple with each other, wherein the length of each of the coupling sections of the first, second, and third distributed-constant lines is one fourth the wavelength of a signal to be used; a first end of the first distributed-constant line serves as a signal input end, the first end of the first distributed-constant line is connected to a first end of the second distributed-constant line, the second end of the second distributed-constant line and a first end of the third distributed-constant line are grounded, the second end of the first distributed-constant line serves as a first signal output end, and the second end of the third distributed-constant line serves as a second signal output end.

When the unbalanced-to-balanced converter is configured as described above, a large output is obtained from the second signal output end without making the intervals between the distributed-constant lines as small as in the conventional balun.

In the unbalanced-to-balanced converter described above, among its three distributed-constant lines, since a distributed-constant line in which a standing wave is generated is disposed adjacent to a distributed-constant line to which the power of the standing wave is transferred, there is no need to place the distributed-constant lines very close, and a low-cost unbalanced-to-balanced converter can be obtained by the use of inexpensive manufacturing technology.

DETAILED DESCRIPTION OF AN EMBODIMENT OF THE INVENTION

Figure 1:
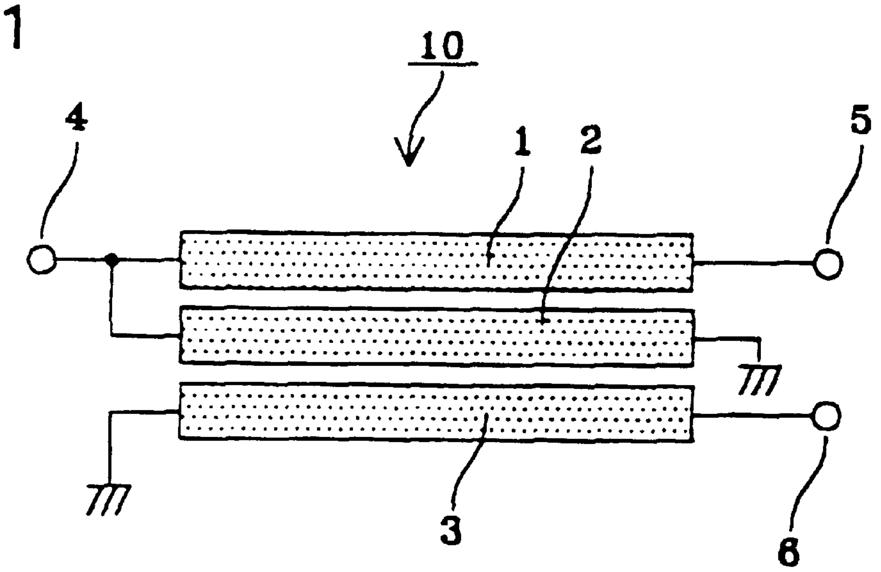
FIG. 1 shows an unbalanced-to-balanced converter according to an embodiment of the present invention.
Figure 2:
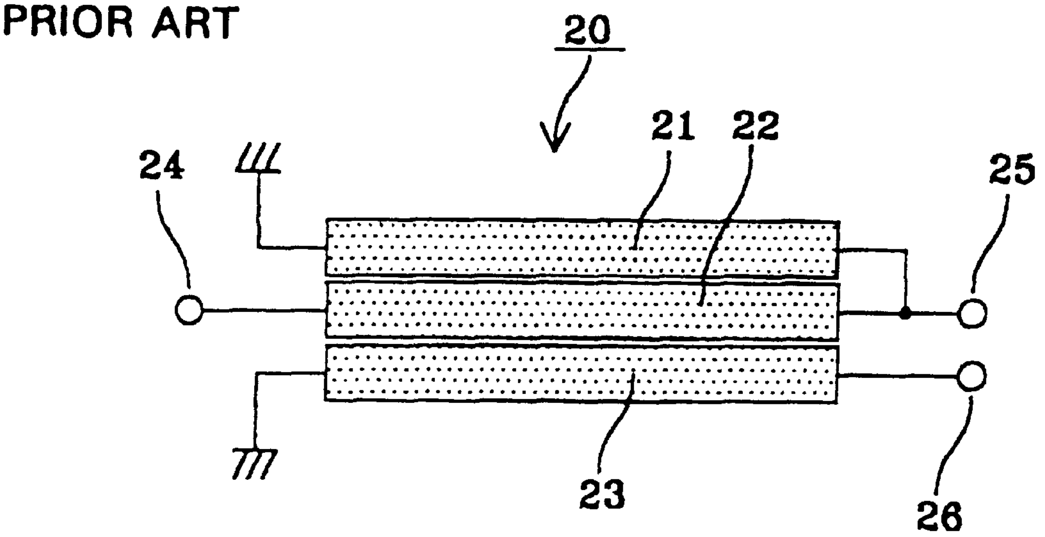
FIG. 2 PRIOR ART
FIG. 2 shows a conventional unbalanced-to-balanced converter.

FIG. 1 shows a directional coupler according to an embodiment of the present invention. In FIG. 1, an unbalanced-to-balanced converter 10 includes microstriplines 1, 2, and 3 serving as first, second, and third distributed-constant lines disposed sufficiently close to be coupled with each other, a signal input terminal 4, and signal output terminals 5 and 6.

In FIG. 1, the signal input terminal 4 is connected to the left-hand end of the first microstripline 1 serving as a signal input end, a signal output terminal 5 is connected to the right-hand end of the first microstripline 1 serving as a first signal output end, and a signal output terminal 6 is connected to the right-hand end of the third microstripline 3 serving as a second signal output end. The left-hand ends of the first and second microstriplines 1, 2 are connected to each other, and the right-hand end of the second microstripline 2 and the left-hand end of the third microstripline 3 are grounded.

The microstriplines 1, 2, and 3 are designed such that their length equals one fourth the wavelength of a signal to be used.

In the unbalanced-to-balanced converter 10 configured as described above, when a signal is input to the signal input terminal 4, a part of the signal passes through the microstripline 1 and is output from the signal output terminal 5, and another part of the signal resonates in the microstripline 2 and generates a standing wave. The power of the standing wave generated in the microstripline 2 is transferred to the microstripline 3 and is output from the signal output terminal 6. The microstriplines 1, 2, and 3 are disposed to have intervals among them such that a signal output from the signal output terminal 5 has the same level as that output from the signal output terminal 6. The signals output from the signal output terminals 5 and 6 have phases 180 degrees apart. In this way, one signal is divided into two signals having phases 180 degrees apart and having the same level.

In the unbalanced-to-balanced converter 10 configured as described above, the distributed-constant line 2 in which the standing wave is generated is disposed adjacent to the distributed-constant line 3 to which the power of the standing wave is transferred. Therefore, the distributed-constant line 2 and the distributed-constant line 3 are strongly coupled and the power is easily transferred from the distributed-constant line 2 to the distributed-constant line 3. Thus, to transfer half of the power of an input signal, the converter may have larger intervals between the distributed-constant lines than in the conventional unbalanced-to-balanced converter 20, and advanced manufacturing technology is not necessarily required.

According to an experiment performed by the inventors of the present invention, for example, in a conventional structure, the intervals between the microstriplines needed to be 5 μm or less in order to form an unbalanced-to-balanced converter on a highly dielectric substrate having a relative dielectric constant of about 100. In contrast, a converter having a structure as described above obtained the same performance as that having the conventional structure, with the intervals being set to 10 μm or more. Hence, an unbalanced-to-balanced converter can be obtained at low cost by the use of relatively inexpensive manufacturing technology.

In the above-described embodiment, microstriplines are used as the distributed-constant lines. However, striplines may be used instead, to obtain the same advantages.

What is claimed is:

1. An unbalanced-to-balanced converter for use at a given wavelength, comprising:

first, second, and third distributed-constant lines disposed in this order and arranged for being electromagnetically coupled with each other;

said first, second, and third distributed-constant lines having coupling sections whose length is substantially one fourth of said given wavelength; and a first end of said first distributed-constant line is an input terminal, said first end of said first distributed-constant line is connected to a first end of said second distributed-constant line, a second end of said second distributed-constant line and a first end of said third distributed-constant line are grounded, a second end of said first distributed-constant line is a first output terminal, and a second end of said third distributed-constant line is a second output terminal, wherein said first, second and third distributed-constant lines are disposed so that in response to an input signal received at said input terminal, a pair of output signals appear at said first and second output terminals having phases substantially 180° apart and having substantially the same level, and wherein said first, second and third distributed-constant lines are at least 10 μm apart.

2. A converter as in claim 1, wherein each of said output signals has substantially half the power of said input signal.

3. An unbalanced-to-balanced converter for use at a given wavelength, comprising:

first, second, and third distributed-constant lines disposed in this order and arranged for being electromagnetically coupled with each other;

said first, second, and third distributed-constant lines having coupling sections whose length is substantially one fourth of said given wavelength; and a first end of said first distributed-constant line is an input terminal, said first end of said first distributed-constant line is connected to a first end of said second distributed-constant line, a second end of said second distributed-constant line and a first end of said third distributed-constant line are grounded, a second end of said first distributed-constant line is a first output terminal, and a second end of said third distributed-constant line is a second output terminal, wherein said first, second and third distributed-constant lines are disposed substantially parallel with each other on a dielectric substrate, and wherein said first, second and third distributed-constant lines are at least 10 μm apart.

4. A converter as in claim 3, wherein said first, second and third distributed-constant lines are constituted by respective microstriplines.

5. A converter as in claim 3, wherein said first, second and third distributed-constant lines are constituted by respective striplines.

6. An unbalanced-to-balanced converter for use at a given wavelength, comprising:

first, second, and third distributed-constant lines disposed in this order and arranged for being electromagnetically coupled with each other;

said first, second, and third distributed-constant lines having coupling sections whose length is substantially one fourth of said given wavelength; and a first end of said first distributed-constant line is an input terminal, said first end of said first distributed-constant line is connected to a first end of said second distributed-constant line, a second end of said second distributed-constant line and a first end of said third distributed-constant line are grounded, a second end of said first distributed-constant line is a first output terminal, and a second end of said third distributed-constant line is a second output terminal, wherein said first, second and third distributed constant lines are at least 10 μm apart.

* * * * *